(12) United States Patent
Hung et al.

(10) Patent No.: US 9,978,867 B1
(45) Date of Patent: May 22, 2018

(54) SEMICONDUCTOR SUBSTRATE STRUCTURES, SEMICONDUCTOR DEVICES AND METHODS FOR FORMING THE SAME

(71) Applicant: Vanguard International Semiconductor Corporation, Hsinchu (TW)

(72) Inventors: Pei-Heng Hung, New Taipei (TW); Manoj Kumar, Jharkhand (IN); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days. days.

(21) Appl. No.: 15/345,852

(22) Filed: Nov. 8, 2016

(51) Int. Cl.
*H01L 29/36* (2006.01)
*H01L 29/78* (2006.01)
*H01L 29/06* (2006.01)
*H01L 21/265* (2006.01)
*H01L 21/762* (2006.01)

(52) U.S. Cl.
CPC ........ *H01L 29/7835* (2013.01); *H01L 21/265* (2013.01); *H01L 21/76243* (2013.01); *H01L 29/0649* (2013.01); *H01L 29/36* (2013.01)

(58) Field of Classification Search
CPC combination set(s) only.
See application file for complete search history.

(56) References Cited

U.S. PATENT DOCUMENTS

| 2010/0301413 A1* | 12/2010 | You | H01L 27/0922 257/343 |
|---|---|---|---|
| 2015/0069503 A1* | 3/2015 | Chang | H01L 29/7813 257/330 |
| 2017/0025532 A1* | 1/2017 | Mori | H01L 29/7823 |

* cited by examiner

*Primary Examiner* — Marcos D Pizarro
*Assistant Examiner* — Shannon Yi
(74) *Attorney, Agent, or Firm* — Birch, Stewart, Kolasch & Birch, LLP

(57) ABSTRACT

A semiconductor substrate structure includes a substrate having a first conductivity type, an oxide layer disposed on the substrate, and a semiconductor layer disposed on the oxide layer. The semiconductor substrate structure also includes a first buried layer disposed in the semiconductor layer, having a second conductivity type opposite to the first conductivity type. The semiconductor substrate structure further includes a second buried layer disposed in the semiconductor layer and above the first buried layer, having the first conductivity type, wherein the first buried layer and the second buried layer are separated by a distance.

12 Claims, 9 Drawing Sheets

SEMICONDUCTOR SUBSTRATE STRUCTURES, SEMICONDUCTOR DEVICES AND METHODS FOR FORMING THE SAME

BACKGROUND OF THE INVENTION

Field of the Invention

The invention relates to semiconductor devices, and in particular to semiconductor substrate structures of semiconductor devices and methods for forming the same.

Description of the Related Art

In the semiconductor industry, silicon-on-insulator (SOI) is a silicon-insulator-silicon substrate which can replace conventional silicon substrates. This involves a buried oxide layer sandwiched between the base silicon and the top silicon. The advantages of silicon-on-insulator technology relative to conventional bulk silicon substrates include lower leakage current, higher power efficiency, lower parasitic capacitance, and resistance to latch-up.

However, in general, silicon-on-insulator devices suffer from the backside bias effect, which is also called the substrate bias effect. The backside bias effect occurs when the breakdown voltage of a metal-oxide-semiconductor field-effect transistor (MOSFET) is affected by the voltage which is applied to the handling wafer. In order to minimize the impact of the backside bias effect, additional circuitry is added by the designers.

Although existing silicon-on-insulator (SOI) substrates of semiconductor devices and methods for forming the same have been adequate for their intended purposes, they have not been entirely satisfactory in all respects. Therefore, up to the present, there are still some problems that can be improved in SOI substrates of semiconductor devices and technology.

BRIEF SUMMARY OF THE INVENTION

Embodiments of semiconductor substrate structures of semiconductor devices and methods for forming the same are provided. The backside bias effect, which changes the breakdown voltages of the metal-oxide-semiconductor field-effect transistors, is one of the main problems of semiconductor devices with silicon-on-insulator substrates. To overcome the aforementioned problems, an n-type buried layer and a p-type buried layer are implanted in the silicon-on-insulator substrates, which can eliminate the backside bias effect without using additional masks for forming additional circuitries for the device in the overall process.

Some embodiments of the disclosure provide a semiconductor substrate structure. The semiconductor substrate structure includes a substrate having a first conductivity type. The semiconductor substrate structure also includes an oxide layer disposed on the substrate. The semiconductor substrate structure further includes a semiconductor layer disposed on the oxide layer. In addition, the semiconductor substrate structure includes a first buried layer disposed in the semiconductor layer, having a second conductivity type opposite to the first conductivity type, and a second buried layer disposed in the semiconductor layer and above the first buried layer, having the first conductivity type, wherein the first buried layer and the second buried layer are separated by a distance.

Some embodiments of the disclosure provide a semiconductor device. The semiconductor device includes a substrate having a first conductivity type. The semiconductor device also includes an oxide layer disposed on the substrate. The semiconductor device further includes a semiconductor layer disposed on the oxide layer. In addition, the semiconductor device includes a first buried layer disposed in the semiconductor layer, having a second conductivity type opposite to the first conductivity type. The semiconductor device also includes a second buried layer disposed in the semiconductor layer and above the first buried layer, having the first conductivity type, wherein the first buried layer and the second buried layer are separated by a distance. The semiconductor device further includes a source electrode and a drain electrode disposed above the semiconductor layer, and a gate structure disposed above the semiconductor layer and between the source electrode and the drain electrode.

Some embodiments of the disclosure provide a method for forming a semiconductor substrate structure. The method includes providing a substrate having a first conductivity type. The method also includes forming an oxide layer on the substrate. The method further includes forming a semiconductor layer on the oxide layer. In addition, the method includes forming a first buried layer in the semiconductor layer, wherein the first buried layer has a second conductivity type opposite to the first conductivity type. The method also includes forming a second buried layer in the semiconductor layer and above the first buried layer, wherein the second buried layer has the first conductivity type, and the first buried layer and the second buried layer are separated by a distance.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
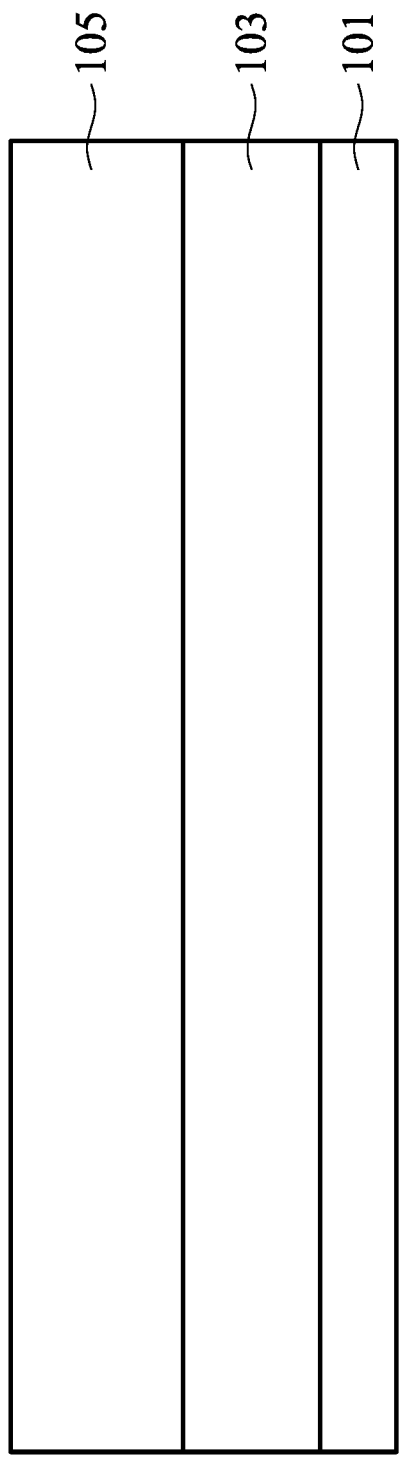
FIGS. 1A to 1B are cross-sectional views illustrating an exemplary sequential forming process of a semiconductor substrate structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1B:
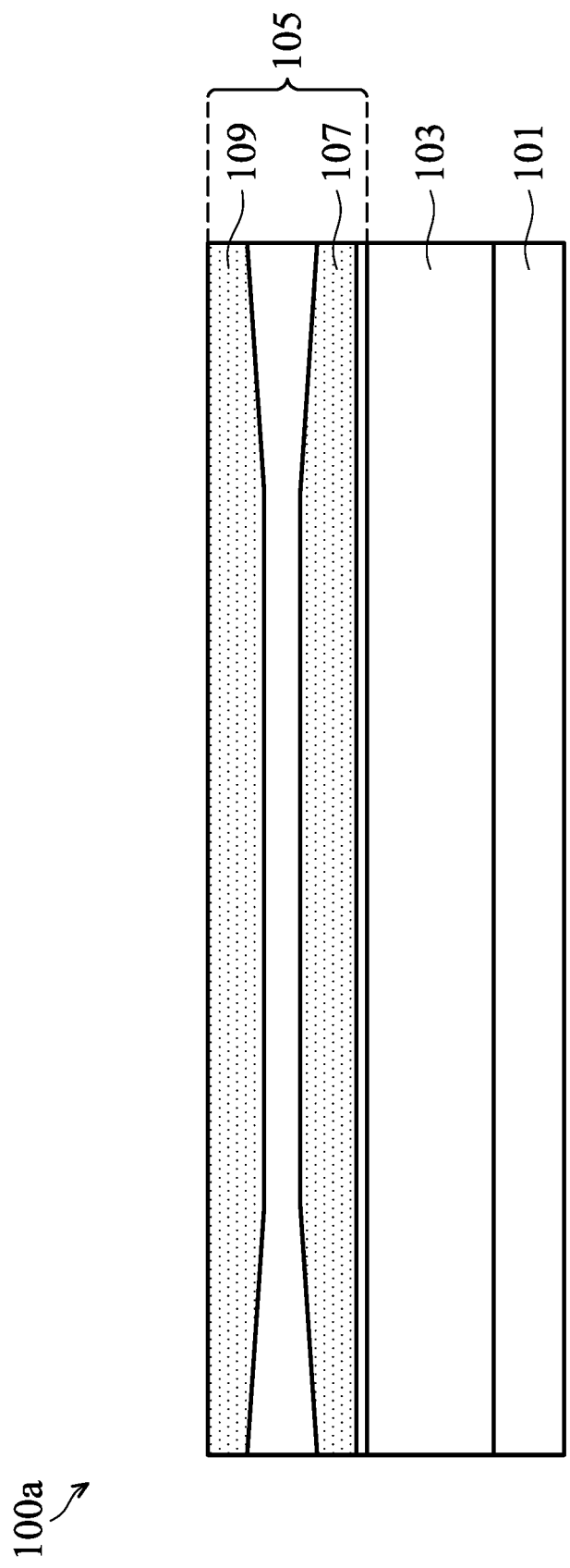

Embodiments for forming a semiconductor substrate structure are provided. FIGS. 1A to 1B are cross-sectional views illustrating an exemplary sequential forming process of a semiconductor substrate structure 100a in accordance with some embodiments.

As shown in FIG. 1A, an oxide layer 103 is formed on a substrate 101, and a semiconductor layer 105 is formed on the oxide layer 103, in accordance with some embodiments. The substrate 101 may be made of silicon or other semiconductor materials. Alternatively, the substrate 101 may include other elementary semiconductor materials such as germanium. In some embodiments, the substrate 101 is made of a compound semiconductor such as silicon carbide, gallium nitride, gallium arsenic, indium arsenide, or indium phosphide. In some embodiments, the substrate 101 is made of an alloy semiconductor such as silicon germanium, silicon germanium carbide, gallium arsenic phosphide, or gallium indium phosphide. In some embodiments, the substrate 101 is an n-type substrate. In other embodiments, the substrate 101 is a p-type substrate.

In some embodiments, the structure of the substrate 101, the oxide layer 103 and the semiconductor layer 105 is formed by a process called separation by implantation of oxygen (SIMOX). In the separation by implantation of oxygen process, an oxygen ion beam is implanted into a silicon wafer with high energy. Then, the implanted oxygen ion will react with the silicon, and the oxide layer 103 may be formed below the surface of the silicon wafer by using a high-temperature annealing process. In this process, the portion of the silicon wafer below the oxide layer 103 is the substrate 101, and the portion of the silicon wafer above the oxide layer 103 is the semiconductor layer 105.

In other embodiments, the structure of the substrate 101, the oxide layer 103 and the semiconductor layer 105 is formed by a wafer bonding process, a seed method process, or another applicable process. In the wafer bonding process, the oxide layer 103 is formed by directly bonding oxidized silicon with the semiconductor layer 105. Then, the semiconductor layer 105 is thinned before bonding to the substrate 101. In the seed method process, the semiconductor layer 105 is epitaxially grown on the oxide layer 103, which has already formed on the substrate 101.

In some embodiments, the oxide layer 103 is made of silicon oxide, and the thickness of the oxide layer 103 is in a range from about 0.3 μm to about 10 μm. In some embodiments, the semiconductor layer 105 is made of silicon and can be doped with either n-type dopants or p-type dopants. The thickness of the semiconductor layer 105 is in a range from about 1 μm to about 15 μm.

As shown in FIG. 1B, a first buried layer 107 is formed in the semiconductor layer 105, a second buried layer 109 is formed in the semiconductor layer 105 and above the first buried layer 107, in accordance with some embodiments. Once the second buried layer 109 is formed, the semiconductor substrate structure 100a is completed, and the first buried layer 107 and the second buried layer 109 are separated by a distance d3. In some embodiments, the first buried layer 107 has a conductivity type opposite to the conductivity type of the substrate 101, and the second buried layer 109 has a conductivity type which is the same as the conductivity type of the substrate 101.

In some embodiments, the conductivity type of the substrate 101 is n-type, the conductivity type of the semiconductor layer 105 is p-type, the first buried layer 107 is formed by a first ion implantation process of p-type dopants, and then the second buried layer 109 is formed by a second ion implantation process of n-type dopants. In other embodiments, the conductivity type of the substrate 101 is p-type, the conductivity type of the semiconductor layer 105 is p-type, the first buried layer 107 is formed by a first ion implantation process of n-type dopants, and the second buried layer 109 is formed by a second ion implantation process of p-type dopants. In some embodiments, the first ion implantation process and the second ion implantation process are performed by using masks. In other embodiments, the first ion implantation process and the second ion implantation process are performed without using masks.

In some embodiments, a dopant concentration of the first buried layer 107 and a dopant concentration of the second buried layer 109 are in a range from about $10^{15}$ atom/cm$^3$ to about $10^{17}$ atom/cm$^3$. The dopant concentrations of the first buried layer 107 and the second buried layer 109 may influence the thicknesses of the first buried layer 107 and the second buried layer 109, and the dopant concentrations of the first buried layer 107 and the second buried layer 109 may also influence the distance between the first buried layer 107 and the second buried layer 109.

In addition, embodiments for forming a semiconductor device are provided. FIGS. 2A-2F are cross-sectional views illustrating an exemplary sequential forming process of a semiconductor device 100b in accordance with some embodiments.

Figure 2A:
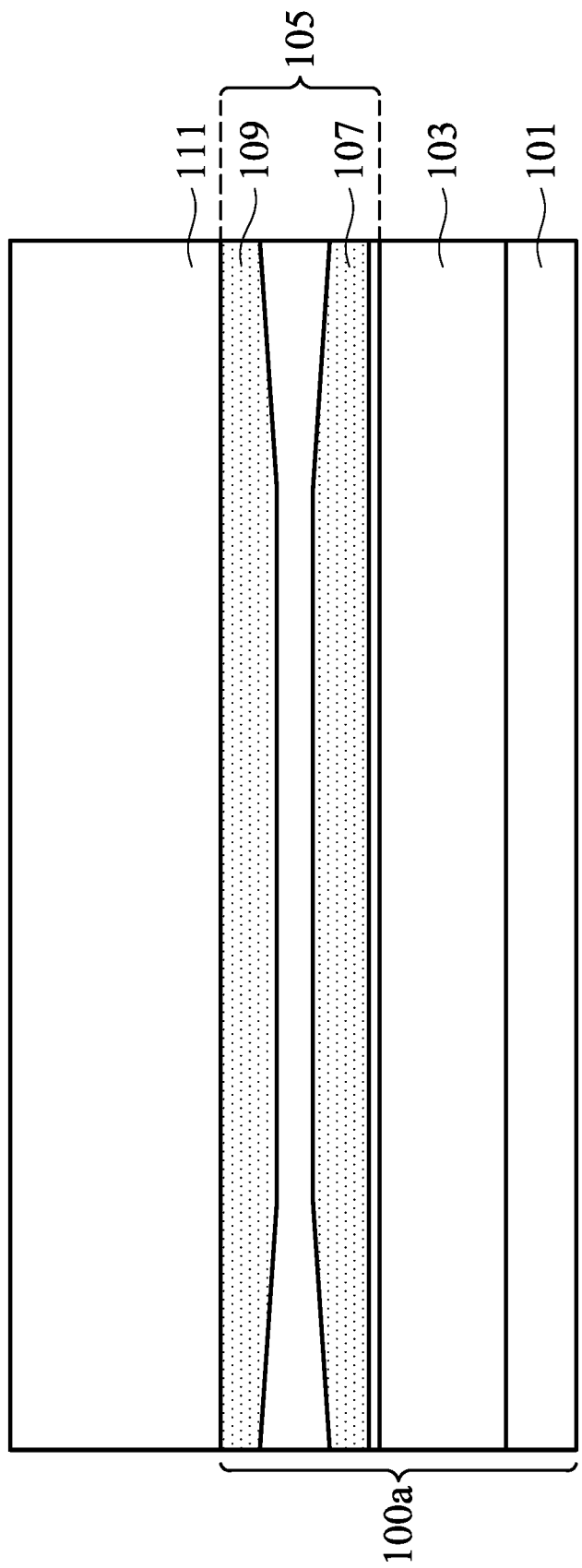
FIGS. 2A-2F are cross-sectional views illustrating an exemplary sequential forming process of a semiconductor device in accordance with some embodiments.

As shown in FIG. 2A, which is continued from FIG. 1B, an epitaxial layer 111 is formed on the semiconductor substrate structure 100a, in accordance with some embodiments. In some embodiments, the epitaxial layer 111 is made of silicon. In some embodiments, the epitaxial layer 111 is formed by using metal organic chemical vapor deposition (MOCVD), molecular beam epitaxy (MBE), or a combination thereof.

In some embodiments, the epitaxial layer 111 may be doped with either n-type dopants or p-type dopants. In some embodiments, the conductivity type of the substrate 101 is n-type, the conductivity type of the semiconductor layer 105 is p-type, the conductivity type of the first buried layer 107 is p-type, the conductivity type of the second buried layer 109 is n-type, and the conductivity type of the epitaxial layer 111 is p-type. The thickness of the epitaxial layer 111 is in a range from about 2 μm to about 15 μm.

Figure 2B:
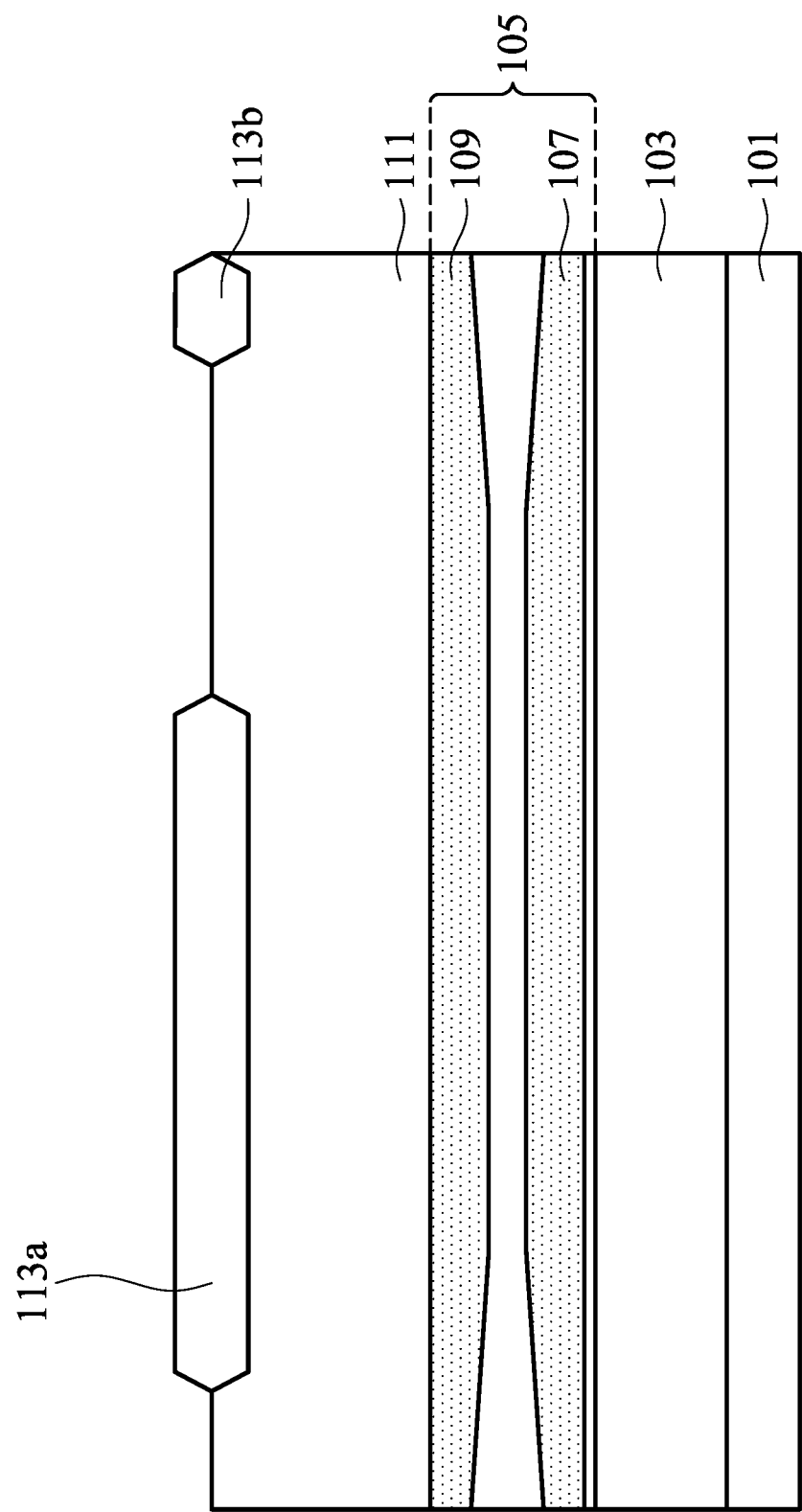

As shown in FIG. 2B, isolation structures 113a and 113b are formed on the epitaxial layer 111, in accordance with some embodiments. More specifically, a portion of the isolation structures 113a and 113b is formed embedded in the epitaxial layer 111, and the other portion of the isolation structures 113a and 113b is formed over the epitaxial layer 111. In some embodiments, the isolation structures 113a and 113b may be formed by using local oxidation of silicon (LOCOS) isolation technology or shallow trench isolation (STI) technology. In some embodiments, the isolation structures 113a and 113b are made of silicon oxide, silicon nitride, silicon oxynitride or another applicable dielectric material.

Figure 2C:
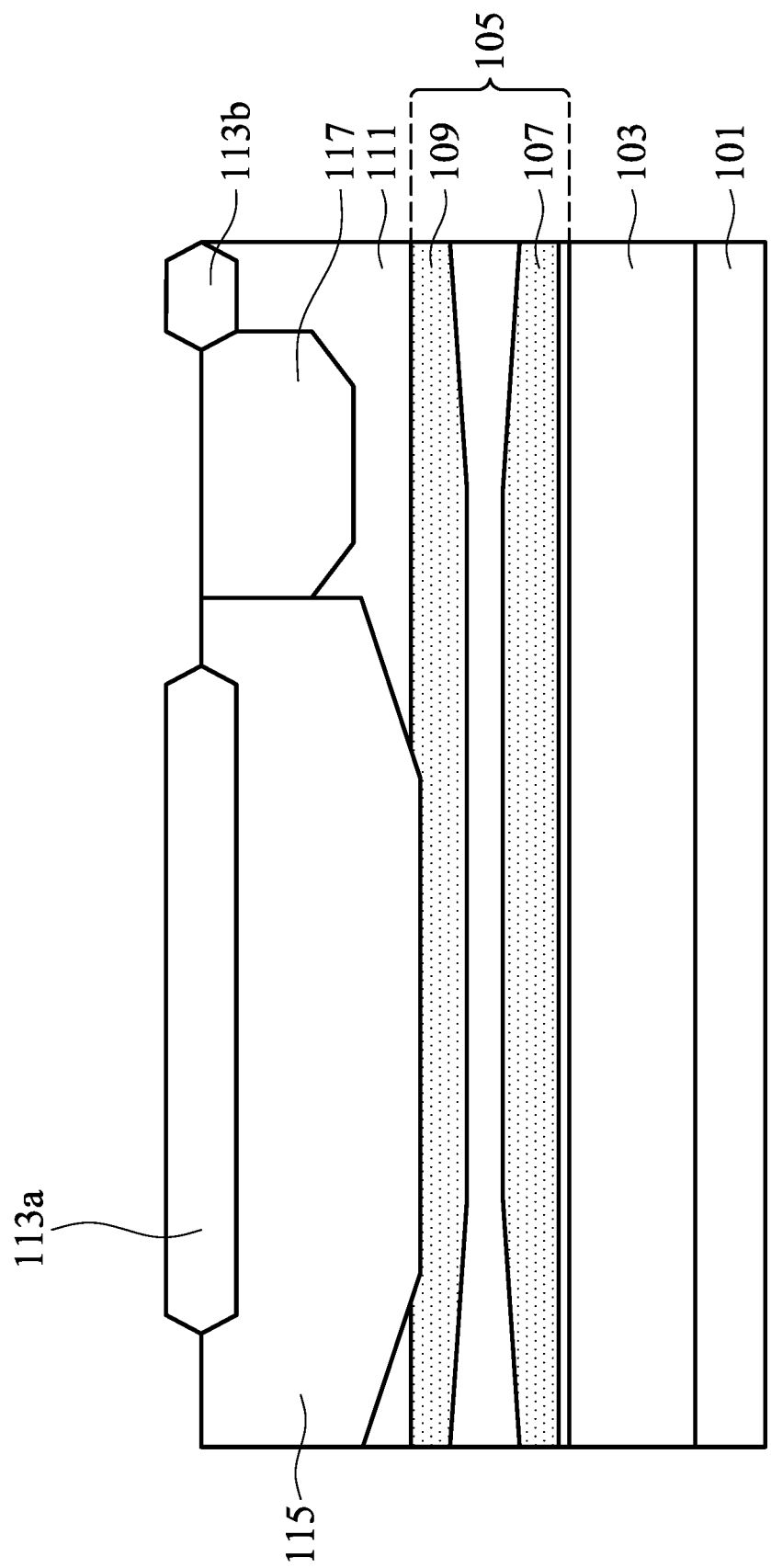

As shown in FIG. 2C, a first well region 115 is formed in the epitaxial layer 111, and a second well region 117 is formed in the epitaxial layer 111 and is adjacent to the first well region 115, in accordance with some embodiments. In addition, a portion of the first well region 115 is formed under the isolation structure 113a, and the second well region 117 is disposed between the isolation structures 113a and 113b.

In some embodiments, the first well region 115 and the second well region 117 are respectively formed by two individual ion implantation processes. For n-type metal-oxide-semiconductor field-effect transistors (NMOS), the first well region 115 is a high-voltage n-well (HVNW), and the second well region 117 is a p-well. For p-type metal-oxide-semiconductor field-effect transistors (PMOS), the first well region 115 is a high-voltage p-well, and the second well region 117 is an n-well.

As shown in FIG. 2C, in the embodiment of NMOS, the first well region 115 of HVNW is in contact with the second buried layer 109, and the second well region 117 is separated from the second buried layer 109 by the epitaxial layer 111, since the conductivity type of the first well region 115 is the same as the conductivity type of the second buried layer 109.

Figure 2D:
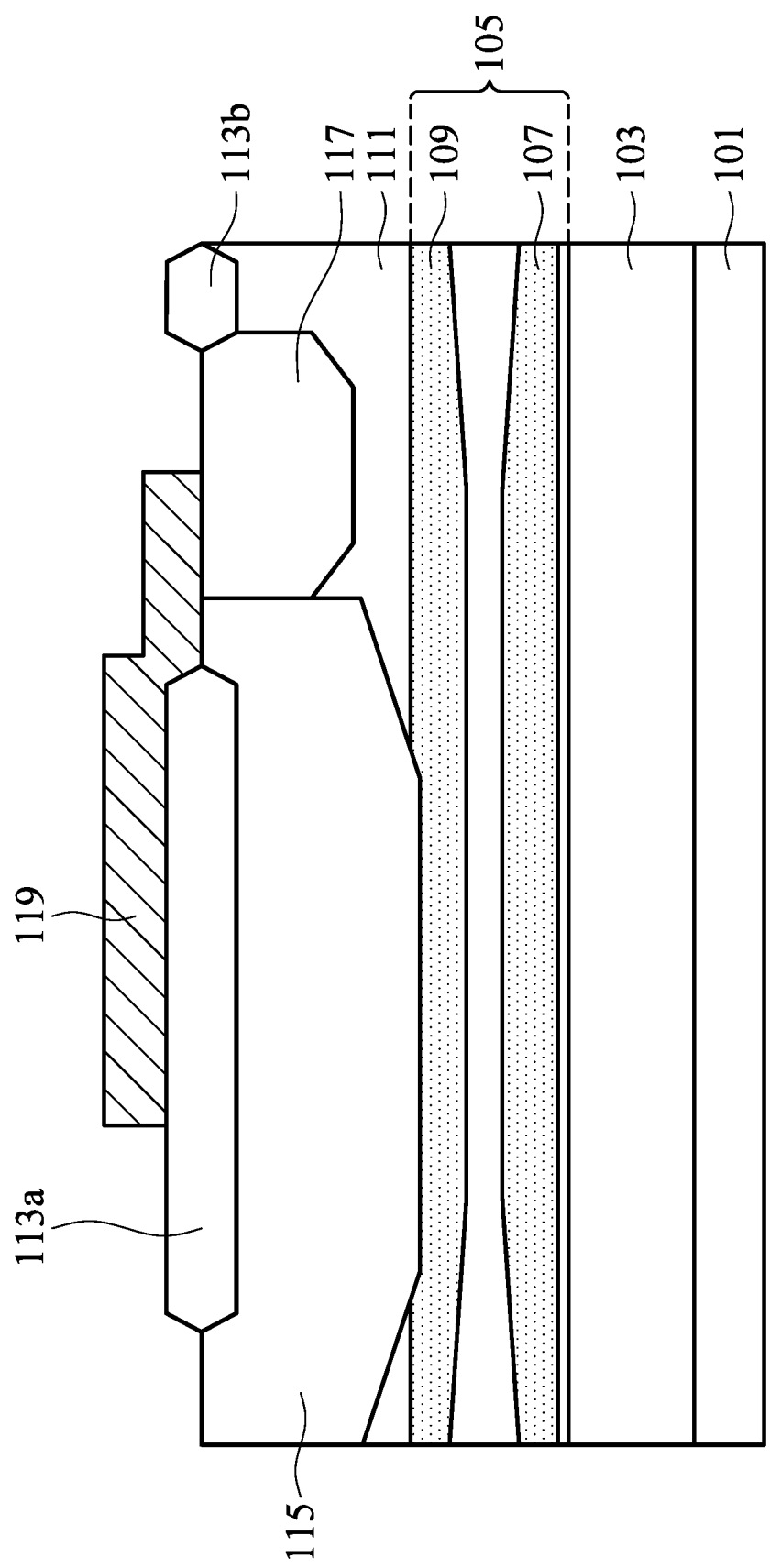

As shown in FIG. 2D, a gate structure 119 is formed over the semiconductor layer 111 and on a portion of the isolation structure 113a, covering a portion of the first well region 115 and a portion of the second well region 117, in accordance with some embodiments. In some embodiments, the gate structure 119 may include a single layer or multiple layers of gate dielectric layers and a single layer or multiple layers of gate electrode layers.

The gate dielectric layers may be made of silicon oxide, silicon nitride, silicon oxynitride, dielectric materials with low dielectric constant (low-k), or a combination thereof. In some embodiments, the gate dielectric layers are deposited by a plasma enhanced chemical vapor deposition (PECVD) process or a spin coating process.

The gate electrode layers are made of conductive materials, such as aluminum (Al), copper (Cu), tungsten (W), titanium (Ti), tantalum (Ta), or other applicable materials. In some embodiments, the gate electrode layers are formed by a deposition process and a patterning process. The deposition process may be a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof.

Figure 2E:
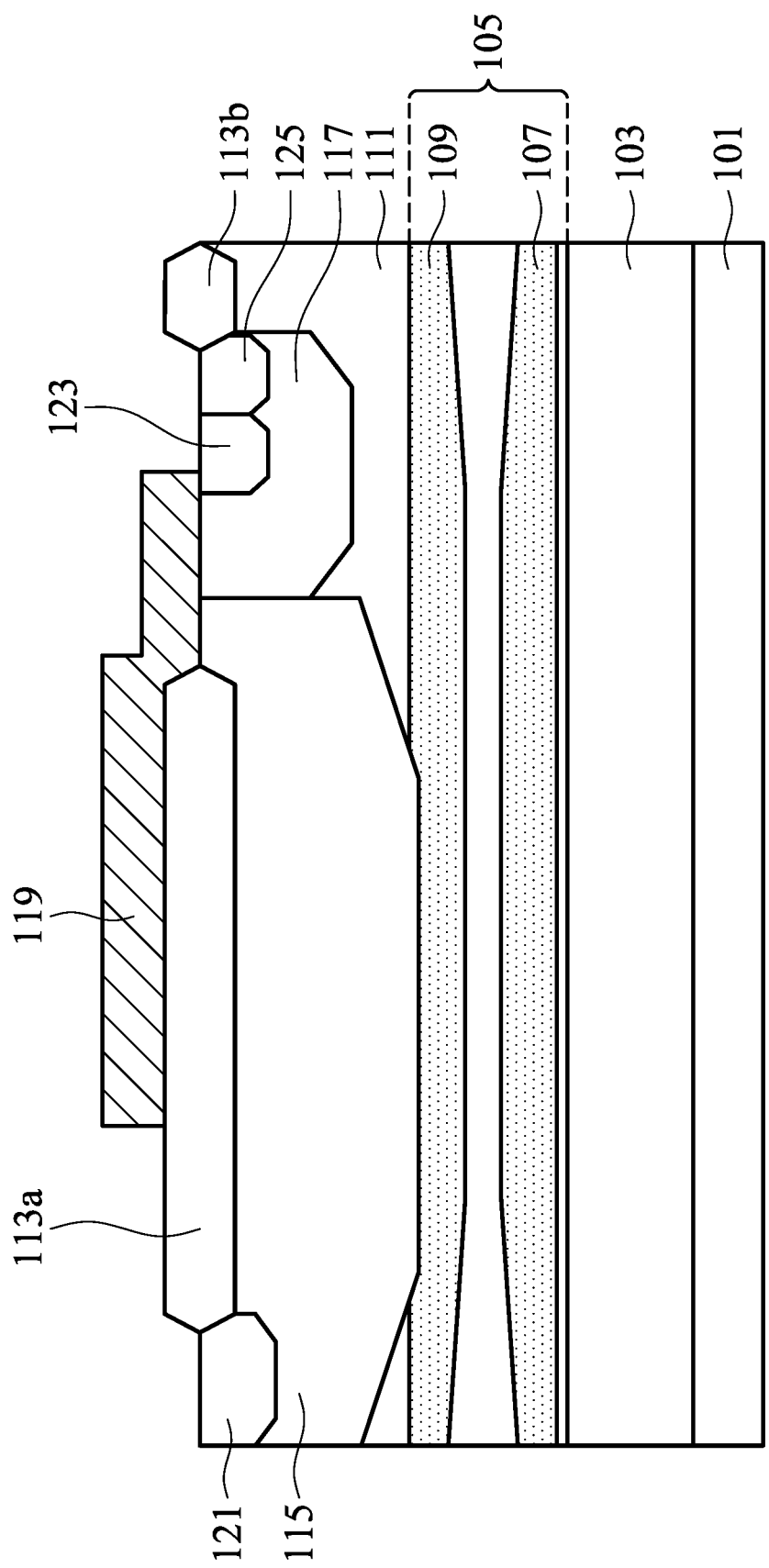

As shown in FIG. 2E, a first doped region 121 is formed in the first well region 115, a second doped region 123 and a third doped region 125 are formed in the second well region 117, in accordance with some embodiments. In addition, the third doped region 125 is adjacent to the second doped region 123. In some embodiments, the conductivity type of the first doped region 121 is the same as that of the first well region 115, the conductivity type of the second doped region 123 is different from that of the second well region 117, and the conductivity type of the third doped region 125 is the same as that of the second well region 117.

Figure 2F:
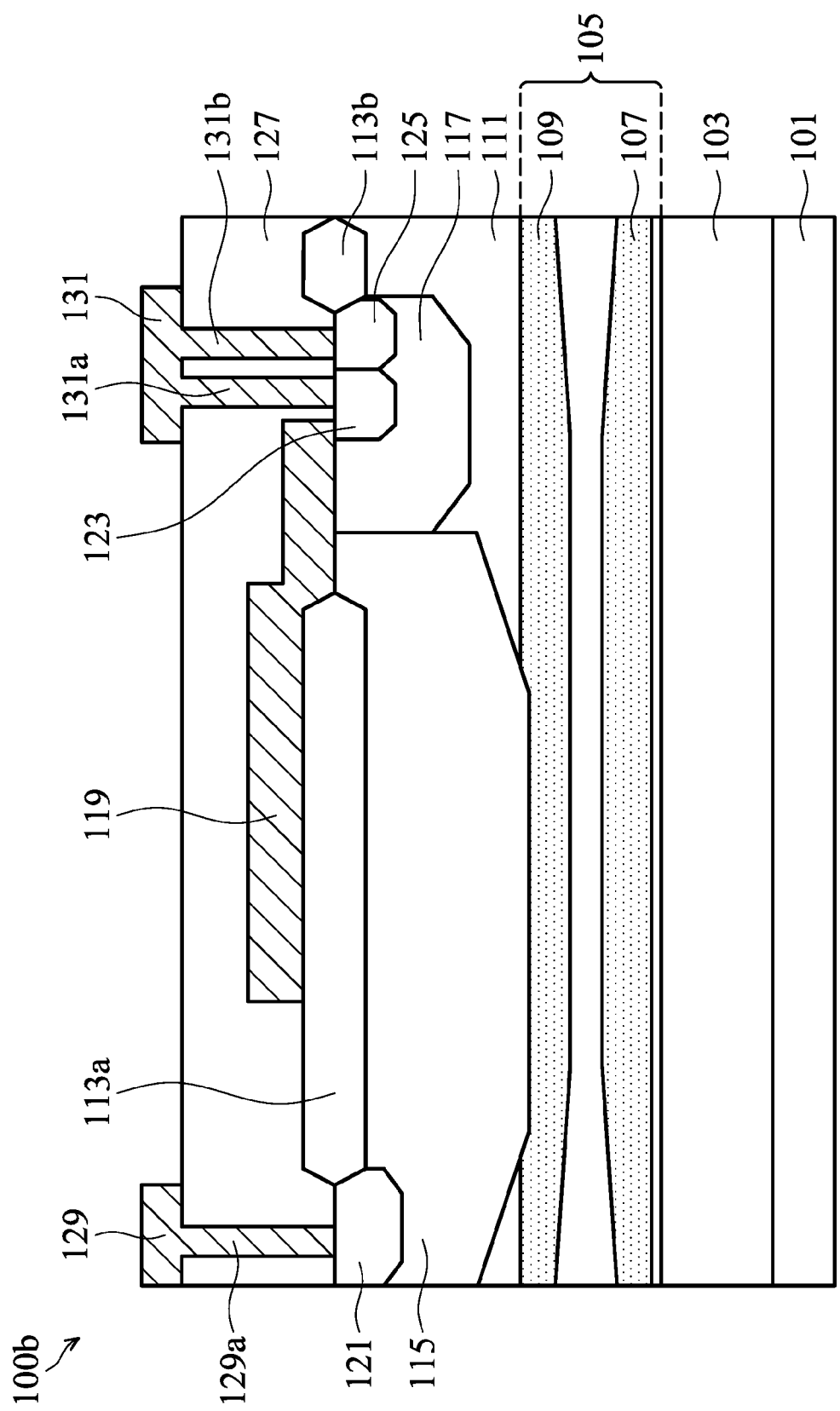

As shown in FIG. 2F, an inter-layer dielectric (ILD) layer 127 is formed over the epitaxial layer 111, the isolation structures 113a and 113b and the gate structure 119, in accordance with some embodiments. In some embodiments, the inter-layer dielectric layer 127 is made of silicon oxide, silicon nitride, phosphosilicate glass (PSG), borophosphosilicate glass (BPSG), and/or other applicable dielectric materials. The inter-layer dielectric layer 127 may be formed by chemical vapor deposition (CVD), physical vapor deposition (PVD), atomic layer deposition (ALD), spin-on coating, or other applicable processes.

After the inter-layer dielectric layer 127 is formed, a source electrode 131 and a drain electrode 129 are formed above the inter-layer dielectric layer 127, as shown in FIG. 2F in accordance with some embodiments. Moreover, the vias 129a, 131a and 131b are formed in the inter-layer dielectric layer 127. The drain electrode 129 is electrically connected to the first doped region 121 through the via 129a, and the source electrode 131 is electrically connected to the second doped region 123 and the third doped region 125 through the vias 131a and 131b. In some embodiments, the source electrode 131, the drain electrode 127 and the vias 129a, 131a and 131b may comprise polysilicon, metal or another suitable electrically conductive material.

In some embodiments, the first doped region 121 is electrically connected to the drain electrode 129, the second doped region 123 and the third doped region 125 are electrically connected to the source electrode 131. In some embodiments, the gate structure 119 is disposed between the source electrode 131 and the drain electrode 129, and the gate structure 119 is closer to the source electrode 131 than the drain electrode 129. Once the source electrode 131 and the drain electrode 129 are formed, the semiconductor device 100b is completed.

Figure 3:
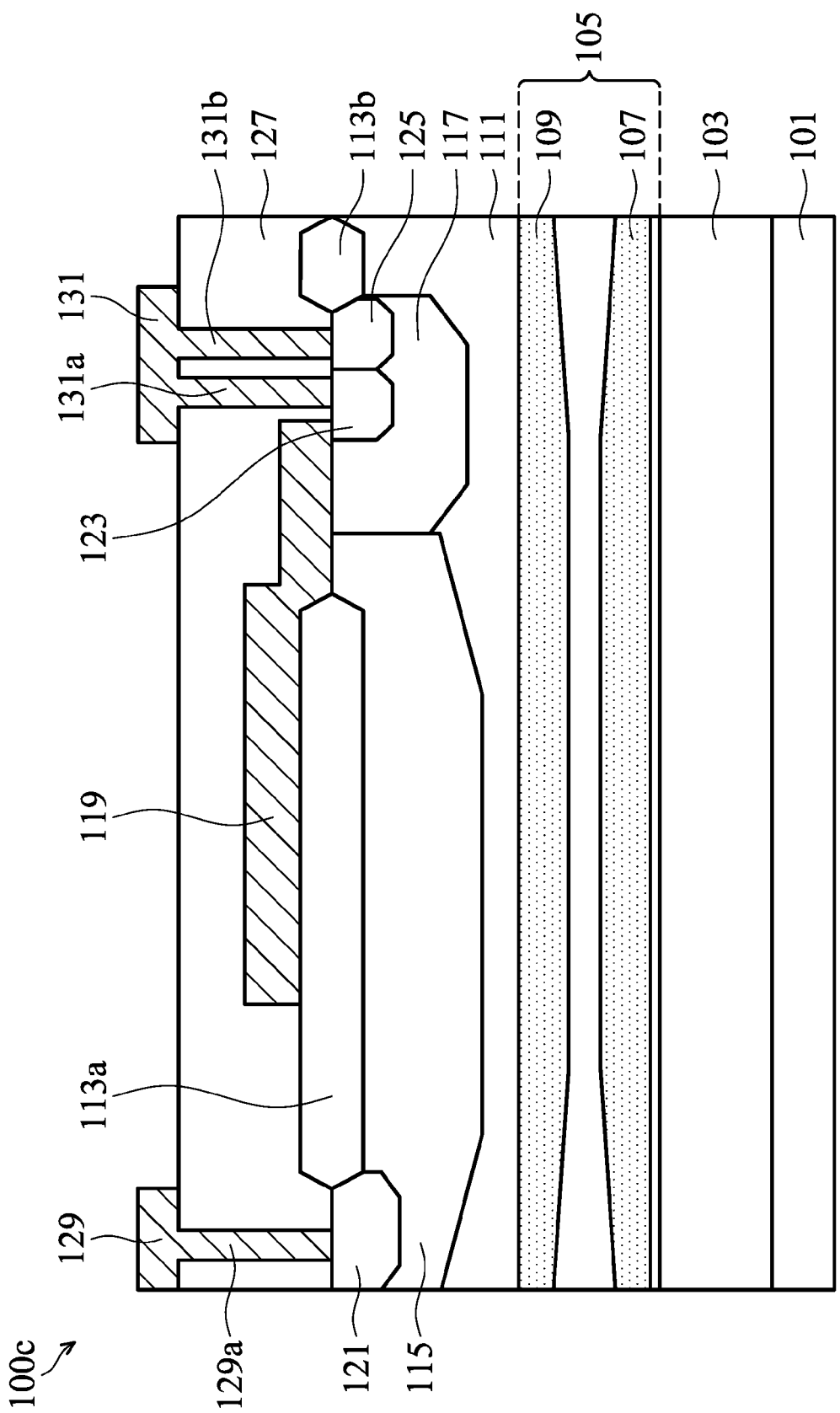
FIG. 3 is a cross-sectional view of a semiconductor device in accordance with other embodiments.

In addition, another embodiment of a semiconductor device 100c is provided. FIG. 3 is a cross-sectional view of the semiconductor device 100c of PMOS in accordance with other embodiments.

In this embodiment of PMOS, the conductivity type of the substrate 101 is n-type, the conductivity type of the first buried layer 107 is p-type, and the conductivity type of the second buried layer 109 is n-type. The first well region 115 is a high-voltage p-well (HVPW), and the second well region 117 is an n-well. The conductivity type of the first doped region 121 is p-type, the conductivity type of the second doped region 123 is p-type, and the conductivity type of the third doped region 125 is n-type.

Moreover, as shown in FIG. 3, both the first well region 115 and the second well region 117 are separated from the second buried layer 109 by the epitaxial layer 111. Since the conductivity type of the first well region 115 is p-type, which is different from the conductivity type of the second buried layer 109, the first well region 115 is separated from the second buried layer 109 by the epitaxial layer 111.

Conventionally, charges may accumulate at the top surface of the oxide layer in the SOI substrate when bias is applied, which prevents the device from becoming fully depleted, and the breakdown voltage may be reduced and the backside bias effect may occur. To overcome the aforementioned problems in semiconductor devices with a silicon-on-insulator (SOI) substrate, an n-type buried layer and a p-type buried layer are implanted in the semiconductor layer of the silicon-on-insulator substrate according to the embodiments of the disclosure, which can increase the breakdown voltage and eliminate the backside bias effect without adding extra implants or using additional masks for forming additional circuitry for the device in the overall process.

Moreover, either an n-type substrate 101 or a p-type substrate 101 can be used in the embodiments of the disclosure, the conductivity type of the first buried layer 107 must be opposite to the conductivity type of the substrate 101, and the conductivity type of the second buried layer 109 must be the same as the conductivity type of the substrate 101.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor substrate structure, comprising:
    a substrate having a first conductivity type;
    an oxide layer disposed on the substrate;
    a semiconductor layer disposed on the oxide layer;
    a first buried layer disposed in the semiconductor layer, having a second conductivity type opposite to the first conductivity type;
    a second buried layer disposed in the semiconductor layer and above the first buried layer, having the first conductivity type, wherein the first buried layer and the second buried layer are separated by a distance;
    an epitaxial layer disposed on the semiconductor layer;
    a first well region and a second well region disposed in the epitaxial layer, wherein the first well region adjoins the second well region, the first well region has the first conductivity type and is in contact with the second buried layer, and the second well region has the second conductivity type and is separated from the second buried layer by the epitaxial layer; and
    a first doped region disposed in the first well region.

2. The semiconductor substrate structure as claimed in claim 1, wherein the first conductivity type is n-type, and the second conductivity type is p-type.

3. The semiconductor substrate structure as claimed in claim 1, wherein the first conductivity type is p-type, and the second conductivity type is n-type.

4. A semiconductor device, comprising:
    a substrate having a first conductivity type;
    an oxide layer disposed on the substrate;
    a semiconductor layer disposed on the oxide layer;
    a first buried layer disposed in the semiconductor layer, having a second conductivity type opposite to the first conductivity type;
    a second buried layer disposed in the semiconductor layer and above the first buried layer, having the first conductivity type, wherein the first buried layer and the second buried layer are separated by a distance;
    an epitaxial layer disposed on the semiconductor layer;
    a first well region and a second well region disposed in the epitaxial layer, wherein the first well region adjoins the second well region, the first well region has the first conductivity type and is in contact with the second buried layer, and the second well region has the second conductivity type and is separated from the second buried layer by the epitaxial layer;
    a first doped region disposed in the first well region;
    a source electrode and a drain electrode disposed on the epitaxial layer; and
    a gate structure disposed on the epitaxial layer and between the source electrode and the drain electrode.

5. The semiconductor device as claimed in claim 4, wherein the first conductivity type is n-type, and the second conductivity type is p-type.

6. The semiconductor device as claimed in claim 4, wherein the first conductivity type is p-type, and the second conductivity type is n-type.

7. The semiconductor device as claimed in claim 4, wherein the gate structure is closer to the source electrode than the drain electrode.

8. The semiconductor device as claimed in claim 4, further comprising:
    an isolation structure covering a portion of the first well region,
    wherein the gate structure is disposed on a portion of the isolation structure and covers a portion of the first well region and a portion of the second well region.

9. The semiconductor device as claimed in claim 4, further comprising:
    a second doped region disposed in the second well region, having the first conductivity type; and
    a third doped region disposed in the second well region, having the second conductivity type and being adjacent to the second doped region,
    wherein the first doped region has the first conductivity type and is electrically connected to the drain electrode, and the second doped region and the third doped region are electrically connected to the source electrode.

10. The semiconductor device as claimed in claim 9, wherein a dopant concentration of the first doped region is greater than that of the first well region, and a dopant concentration of the second doped region and a dopant concentration of the third doped region are greater than that of the second well region.

11. A method for forming a semiconductor substrate structure, comprising:
    providing a substrate having a first conductivity type;
    forming an oxide layer on the substrate;
    forming a semiconductor layer on the oxide layer;
    forming a first buried layer in the semiconductor layer, wherein the first buried layer has a second conductivity type opposite to the first conductivity type;
    forming a second buried layer in the semiconductor layer and above the first buried layer, wherein the second buried layer has the first conductivity type, and the first buried layer and the second buried layer are separated by a distance;
    forming an epitaxial layer on the semiconductor layer;
    forming a first well region and a second well region in the epitaxial layer, wherein the first well region adjoins the second well region, the first well region has the first conductivity type and is in contact with the second buried layer, and the second well region has the second conductivity type and is separated from the second buried layer by the epitaxial layer; and
    forming a first doped region in the first well region.

12. The method as claimed in claim 11, wherein the first buried layer is formed by a first ion implantation process, and the second buried layer is formed by a second ion implantation process.

* * * * *